US010546226B2

(12) United States Patent
Forster

(10) Patent No.: US 10,546,226 B2
(45) Date of Patent: Jan. 28, 2020

(54) FEEDBACK CONTROL OF MOUNTED CHIP PRODUCTION

(71) Applicant: Avery Dennison Retail Information Services, LLC, Mentor, OH (US)

(72) Inventor: Ian J. Forster, Chelmsford-Essex (GB)

(73) Assignee: AVERY DENNISON RETAIL INFORMATION SERVICES LLC, Mentor, OH (US)

( * ) Notice: Subject to any disclaimer, the term of this patent is extended or adjusted under 35 U.S.C. 154(b) by 669 days.

(21) Appl. No.: 15/204,607

(22) Filed: Jul. 7, 2016

(65) Prior Publication Data
US 2018/0012116 A1    Jan. 11, 2018

(51) Int. Cl.
| G06K 19/077 | (2006.01) |
| G01R 31/04 | (2006.01) |
| G06K 7/00 | (2006.01) |
| G01R 31/309 | (2006.01) |
| G01R 31/28 | (2006.01) |

(Continued)

(52) U.S. Cl.
CPC ... *G06K 19/07749* (2013.01); *G06K 19/0775* (2013.01); *G01R 27/2605* (2013.01); *G01R 31/04* (2013.01); *G01R 31/2808* (2013.01); *G01R 31/2812* (2013.01); *G01R 31/2822* (2013.01); *G01R 31/304* (2013.01);
(Continued)

(58) Field of Classification Search
CPC ....... G06K 19/07749; G06K 19/07718; G06K 19/0775; G06K 7/0095; G01R 31/2822; G01R 31/04; G01R 31/2808; G01R 31/2812; G01R 31/304; G01R 31/309; G01R 27/2605
See application file for complete search history.

(56) References Cited

U.S. PATENT DOCUMENTS

| 7,225,992 B2 * | 6/2007 | Forster | G06K 7/0008 |
| | | | 235/492 |
| 7,301,458 B2 * | 11/2007 | Carrender | G01R 31/2822 |
| | | | 235/438 |

(Continued)

OTHER PUBLICATIONS

International Search Report and Written Opinion dated Oct. 20, 2017, issued in corresponding International Application No. PCT/US2017/041071 filed Jul. 7, 2017.

(Continued)

*Primary Examiner* — Jonathan M Dunlap
(74) *Attorney, Agent, or Firm* — Avery Dennison Retail Information Services LLC

(57) ABSTRACT

A feedback control system for RFID assembly production. The control system can include a measurement system and a control system. The measurement system may take measurements of one or more electrical properties of an RFID chip assembly, for example an RFID strap or RFID antenna. The measurement system may then communicate to the control system to adjust one or more parameters affecting the electrical properties. Once the desired set of electrical properties is achieved, the chip assembly may be cured. The feedback control system may be implemented dynamically, either for precision assembly of individual chip assemblies or in batch for controlling the average properties of assemblies on a rolling production line. The feedback control system can also be implemented in a step-wise fashion and be used to collect data and iteratively self-improve.

20 Claims, 6 Drawing Sheets

(51) Int. Cl.
   *G01R 27/26*     (2006.01)
   *G01R 31/304*    (2006.01)
(52) U.S. Cl.
   CPC .......... *G01R 31/309* (2013.01); *G06K 7/0095* (2013.01); *G06K 19/07718* (2013.01)

(56) References Cited

U.S. PATENT DOCUMENTS

| | | | | |
|---|---|---|---|---|
| 7,942,323 | B2* | 5/2011 | Brod | G06K 7/0008 |
| | | | | 235/438 |
| 9,857,413 | B2* | 1/2018 | Farr | G01R 31/2822 |
| 9,874,603 | B2* | 1/2018 | Farr | G01R 31/2884 |
| 2004/0160233 | A1* | 8/2004 | Forster | G06K 7/0008 |
| | | | | 324/667 |
| 2005/0282495 | A1 | 12/2005 | Forster | |
| 2006/0255941 | A1* | 11/2006 | Carrender | G01R 31/2822 |
| | | | | 340/572.1 |
| 2008/0001769 | A1* | 1/2008 | Mayer-Zintel | G01R 31/312 |
| | | | | 340/653 |
| 2008/0272195 | A1* | 11/2008 | Brod | G06K 7/0008 |
| | | | | 235/438 |
| 2016/0003895 | A1* | 1/2016 | Farr | G01R 31/2884 |
| | | | | 324/754.03 |
| 2016/0003898 | A1* | 1/2016 | Farr | G01R 31/2822 |
| | | | | 324/757.01 |
| 2016/0034807 | A1 | 2/2016 | Forster | |

OTHER PUBLICATIONS

International Preliminary Report on Patentability dated Jan. 8, 2019, issued in corresponding International Application No. PCT/US2017/041071 filed Jul. 7, 2017.

* cited by examiner

FEEDBACK CONTROL OF MOUNTED CHIP PRODUCTION

BACKGROUND OF THE INVENTION

Radio frequency identification (RFID) labels and tags are a common tool for labeling, identifying, and tracking various goods and people. The goods so labeled involve a wide range of industries and include packages being shipped, cars, keys, livestock, identification badges, and merchandise in stores. RFID tags, either active or passive, are typically used with an RFID reader to read information from the RFID tag embedded in the label. For passive tags, a typical RFID reader/writer energizes transponder circuitry in the tag by transmitting a power signal. The power signal may convey data, which can be stored in a transponder memory, or the transponder circuitry may transmit a response signal containing data previously stored in its memory. If the transponder circuitry transmits a response signal, the RFID reader/writer receives the response signal and interprets the stored data. The data is then transmitted to a host computer for processing.

Besides directly attaching a chip to an antenna, another current technique for manufacturing RFID chips for use in tags is using a strap assembly system. The strap assembly system includes inserting the RFID chip into an RFID "strap" where the chip is connected to two oversized contact pads. This technique allows for greater mass production of RFID components, as the chip with oversized contacts can be inserted into circuitry, for example connected to an antenna, with much greater ease. The RFID straps are typically mounted on a substrate while being manufactured, and may be mounted on a substrate in use as well.

In both direct attach and strap assembly RFID systems, mass production of the circuitry can lead to some variability in the resulting RFID tags. Sometimes this variability is only detected at the end without a suitable way to correct it. There is a need for a way to dynamically correct errors or variability in RFID systems production.

SUMMARY OF THE INVENTION

A feedback control system for RFID assembly production may be disclosed. The control system can include a measurement system and a control system. The measurement system may take measurements of one or more electrical properties of an RFID chip assembly, for example an RFID strap or RFID antenna. The measurement system may then communicate to the control system to adjust one or more parameters affecting the electrical properties. Once the desired set of electrical properties is achieved, the chip assembly may be cured. The feedback control system may be implemented dynamically, either for precision assembly of individual chip assemblies or in batch for controlling the average properties of assemblies on a rolling production line. The feedback control system can also be implemented in a step-wise fashion and be used to collect data and iteratively self-improve.

BRIEF DESCRIPTION OF THE FIGURES

Advantages of embodiments of the present invention will be apparent from the following detailed description of the exemplary embodiments. The following detailed description should be considered in conjunction with the accompanying figures in which.

Exemplary

Exemplary

Exemplary

Exemplary

Exemplary

Exemplary

Exemplary

Exemplary

Exemplary

Exemplary

Exemplary

DETAILED DESCRIPTION OF THE INVENTION

Figure 1A:
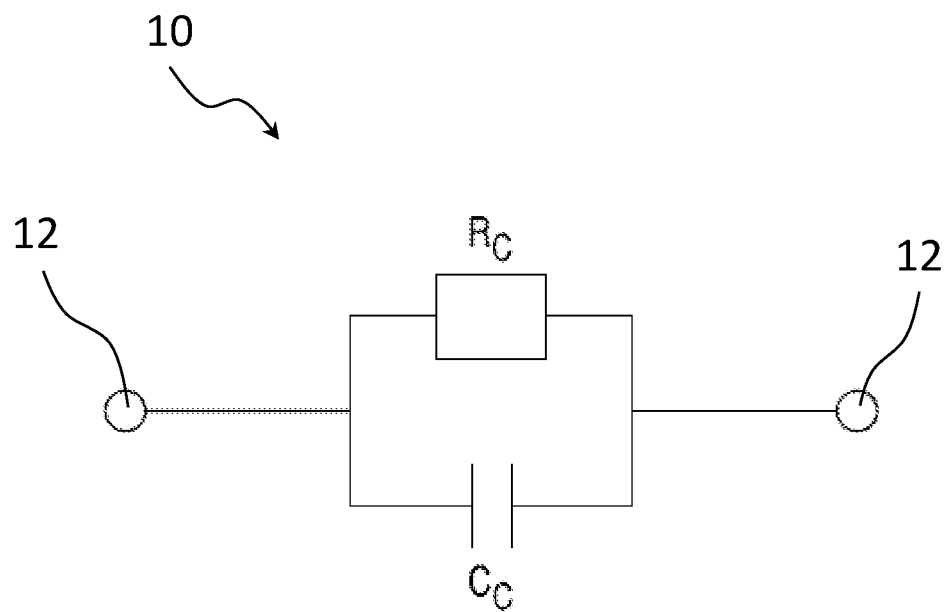
FIG. 1A shows a simple circuit diagram of an RFID chip.

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiment are not necessarily to be construed as preferred or advantageous over other embodiments. Moreover, the terms "embodiments of the invention", "embodiments" or "invention" do not require that all embodiments of the invention include the discussed feature, advantage or mode of operation.

Further, many of the embodiments described herein are described in terms of sequences of actions to be performed by, for example, elements of a computing device. It should be recognized by those skilled in the art that the various sequences of actions described herein can be performed by specific circuits (e.g. application specific integrated circuits (ASICs)) and/or by program instructions executed by at least one processor. Additionally, the sequence of actions described herein can be embodied entirely within any form of computer-readable storage medium such that execution of the sequence of actions enables the at least one processor to perform the functionality described herein. Furthermore, the sequence of actions described herein can be embodied in a combination of hardware and software. Thus, the various aspects of the present invention may be embodied in a number of different forms, all of which have been contemplated to be within the scope of the claimed subject matter. In addition, for each of the embodiments described herein, the corresponding form of any such embodiment may be described herein as, for example, "a computer configured to" perform the described action.

According to at least one exemplary embodiment, a feedback control system for RFID assembly production may be described. The control system can include a measurement system and a control system. The measurement system may take measurements of one or more electrical properties of an RFID chip assembly, for example an RFID strap or RFID antenna. The measurement system may then communicate to the control system to adjust one or more parameters affecting the electrical properties. Once the desired set of electrical properties is achieved, the chip assembly may be cured. The feedback control system may be implemented dynamically, either for precision assembly of individual chip assemblies or in batch for controlling the average properties of assemblies on a rolling production line. The feedback control system can also be implemented in a step-wise fashion and be used to collect data and iteratively self-improve.

Figure 1B:
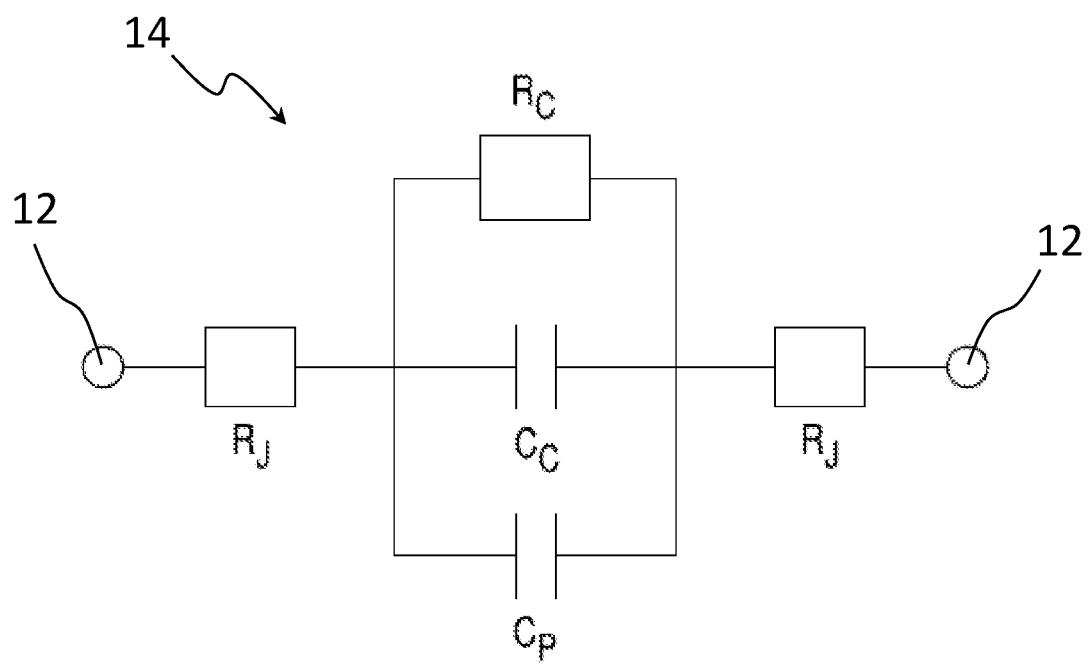
FIG. 1B shows a simple circuit diagram for a mounted RFID chip.

Referring to exemplary FIGS. 1A and 1B, an RFID chip 10 may include two connection points 12 and may have a chip resistance $R_C$ and a chip capacitance $C_C$. A mounted RFID chip 14 may further include joint resistance $R_J$ and a parasitic capacitance $C_P$. The chip resistance may be primarily dependent on the processing of the chip at the wafer level. The joint resistance, in a stable assembly process, may be negligible compared to the chip resistance, and can generally be assumed to be constant. The present invention contemplates that the connection means may be any form known in the art such as conductive, electric, magnetic, capacitive and/or any combination thereof.

Figure 2A:
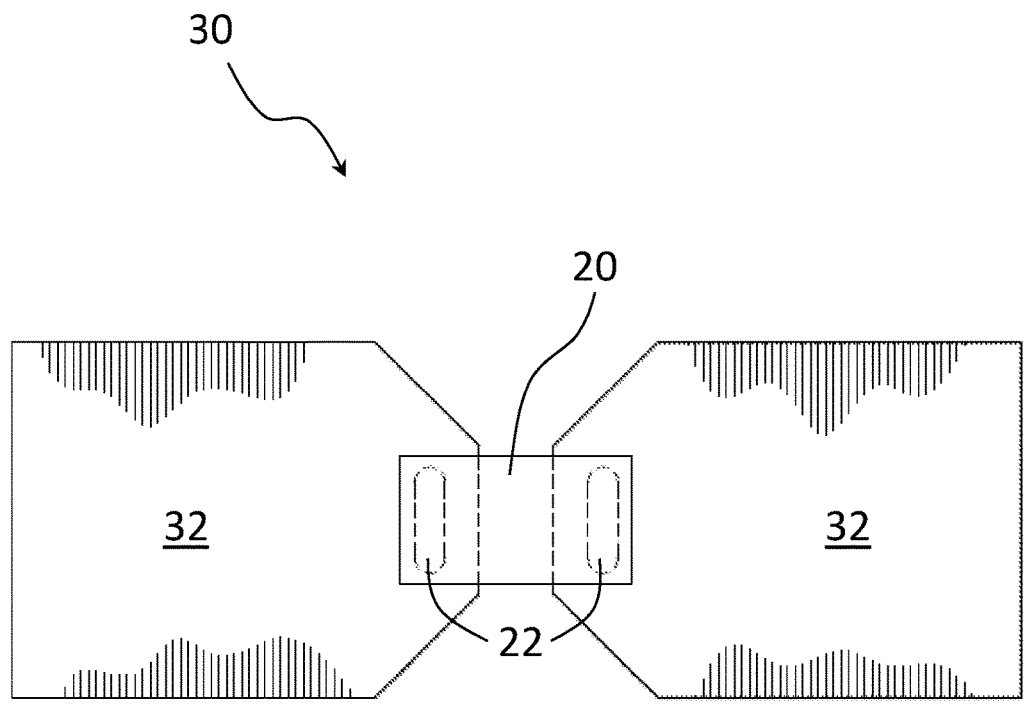
FIG. 2A shows a top view of an RFID chip mounted on an RFID strap.
Figure 2B:
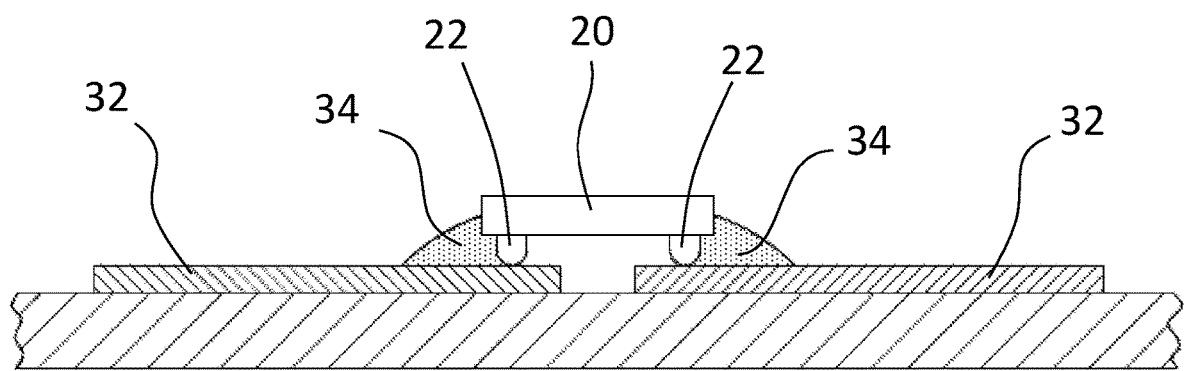
FIG. 2B shows a side view of an RFID chip mounted on an RFID strap.

Referring to exemplary FIGS. 2A and 2B, an RFID chip 20 may be mounted as part of an RFID strap 30. RFID strap 30 may also include contact pads 32. RFID chip 20 may be electrically coupled to contact pads 32 by way of connection points 22. Connection points 22 may include raised areas on a chip's surface. An adhesive 34 may be used to bind chip 20 to contact pads 32. Adhesive 34 may also contain electrically conductive particles which may assist with the formation of an electrical contact between RFID chip 20 and pads 32.

Figure 3:
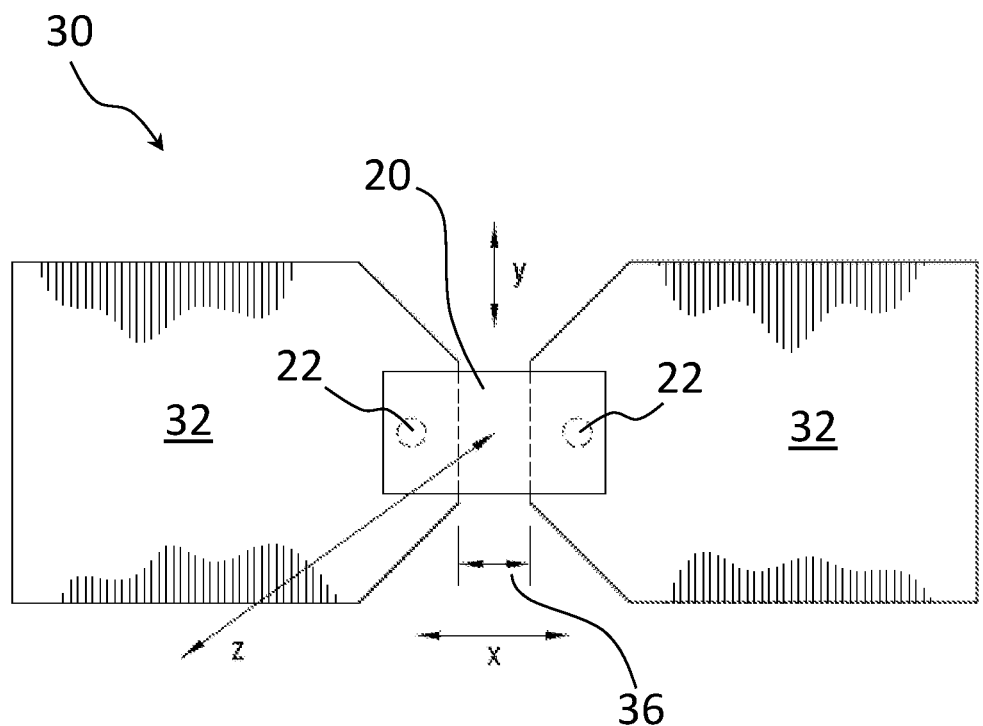
FIG. 3 shows an RFID strap with reference axes shown.

Exemplary FIG. 3 shows RFID strap 30 with RFID chip 20, connection points 22, and contact pads 32. The parasitic capacitance $C_P$ can be a function of the size and shape of the overlap area between chip 20 and contact pads 32 and their relative positions, the size of gap 36 between contact pads 32, the dielectric constant of adhesive 34, and the separation between the surfaces of chip 20 and contact pads 32. All of these parameters are subject to the assembly process and can potentially vary from strap to strap. The capacitance of an RFID strap $C_S$, when joint resistance $R_J$, is negligible, is therefore defined by:

$$C_S = C_C + C_P$$

Figure 4:
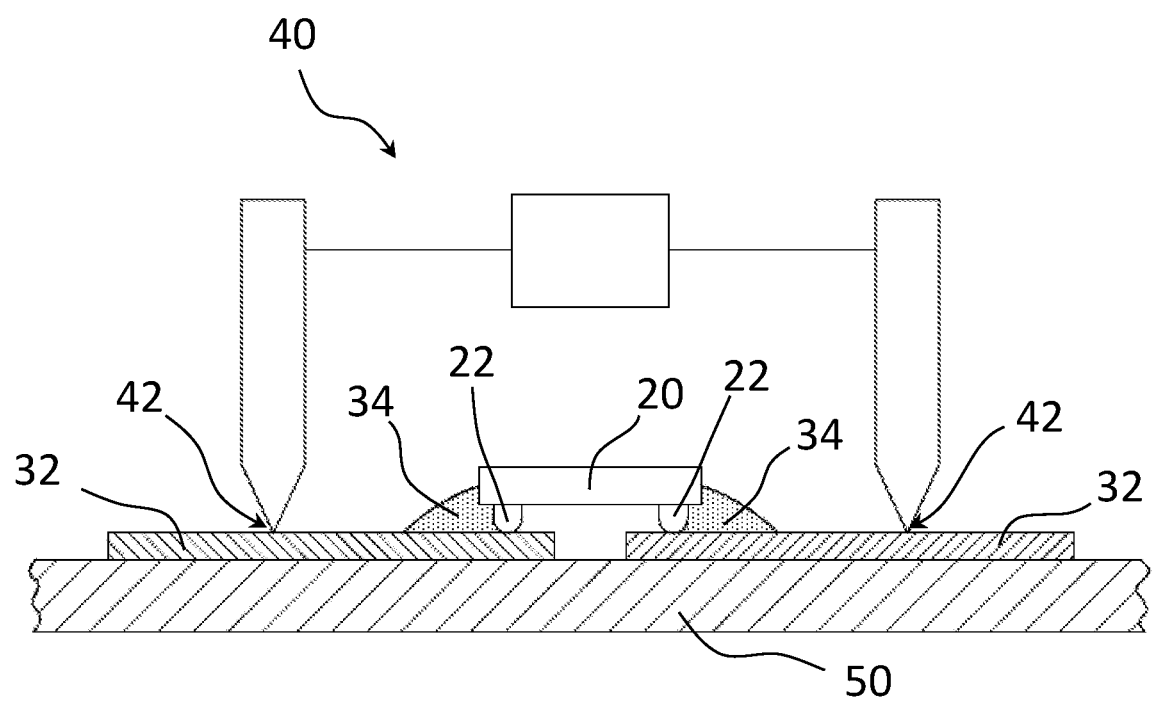
FIG. 4 shows a conventional method for measuring electrical properties of an RFID strap.

Referring to exemplary FIG. 4, a conventional measuring system 40 for measuring the capacitance and/or resistance of an RFID strap 30 may utilize contact points 42 with which to create an electrical contact with contact pads 32 of RFID strap 30. Exemplary FIG. 4 also shows that measuring can be done while strap 30 is mounted on a substrate 50. Substrate 50 may be for example, a web used in production, such as a conveyer belt, heat stabilized PET, paper, or as desired. In some exemplary embodiments, conventional measuring system 40 may be a vector network analyzer, impedance analyzer, or any other system capable of measuring a connection between chip 20 contact pads 32, or any other component such as an antenna (not shown), or as desired. Chip attach systems may have some variability in these parameters, and they may have differing contributions to the overall $C_P$ and $R_P$. For example, one major contribution is the effect of the separation spacing between the surface of chip 20 and pads 32.

Figure 5:
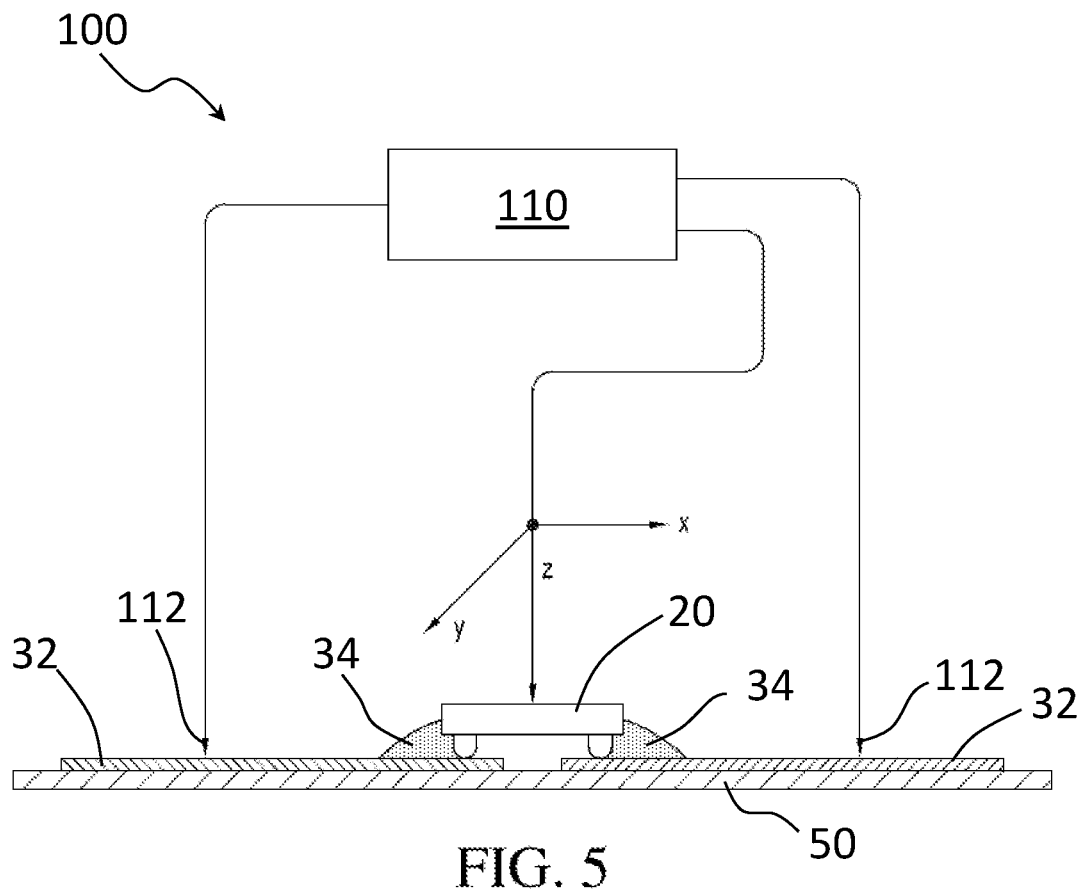
FIG. 5 shows a schematic of a feedback control system for RFID mounted chip/chip assembly production.

Now referring to exemplary FIG. 5, a feedback control system 100 may be used to dynamically adjust the electrical characteristics of an RFID strap 30 mounted on a substrate 50. Feedback control system 100 may include a measurement system 110 and a control mechanism 120 (as shown in exemplary FIG. 6). Measurement system 110 may further include contact points 112 which may allow feedback control system to continuously measure electrical properties, for example capacitance and resistance, across RFID strap 30. Contact points 112 may make direct electrical connection with RFID strap 30, or use any other suitable method, as desired. Control mechanism 120 may adjust the physical attachment or connection of RFID chip 20 with pads 32 until a desired set of electrical properties is achieved. Adjustment may include moving the chip in any of the three coordinate axes (x, y, and z), shown here for reference. Adjustment may involve moving a device carrying the chip, a pin ejecting the chip from a wafer and pushing it into contact with the bond area, control of parameters such as air pressure, magnetic fields, electroelastic polymers, and other means of creating force in one or more of the x, y, and z directions. Feedback control system 100 may also be used in other chip mountings, for example in attaching a chip directly to an antenna, or as desired. Measurement system 110 may further include a computer or computing device which may be capable of determining whether the desired electrical properties have been achieved.

Figure 6:
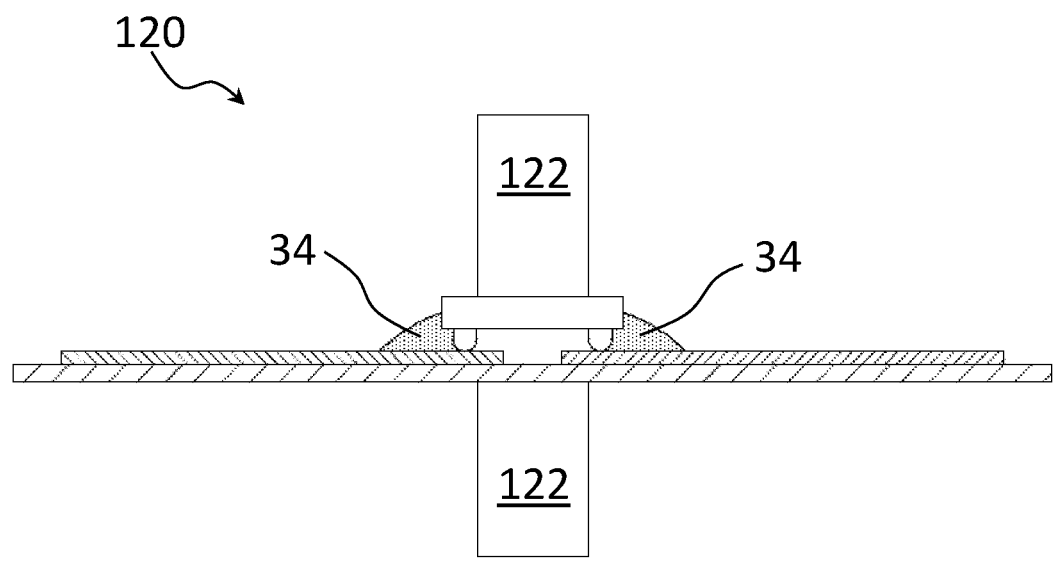
FIG. 6 shows one possible control system for RFID assembly production.

Exemplary FIG. 6 shows one exemplary embodiment of a control mechanism as described above and shown schematically in exemplary FIG. 5. One exemplary embodiment of a control mechanism 120 is a thermo-compression process using heated blocks 122. Thermo-compression is a process by which an RFID chip 20 is pressed into a mount, for example strap 30, with an adhesive 34. The pressure may be applied by heated blocks 122. In at least one exemplary embodiment, a measurement system as shown in exemplary FIG. 5 and described above, may be used in conjunction with heated blocks 122 to achieve a desired z-direction spacing between the surface of an RFID chip 20 and pads 32, and thereby achieve a desired set of electrical properties of the resulting RFID strap 30. Once a desired spacing is achieved, heated blocks 122 may cure adhesive 34. Heated blocks may be heated to temperatures of approximately 160-180° C.

Figure 7:
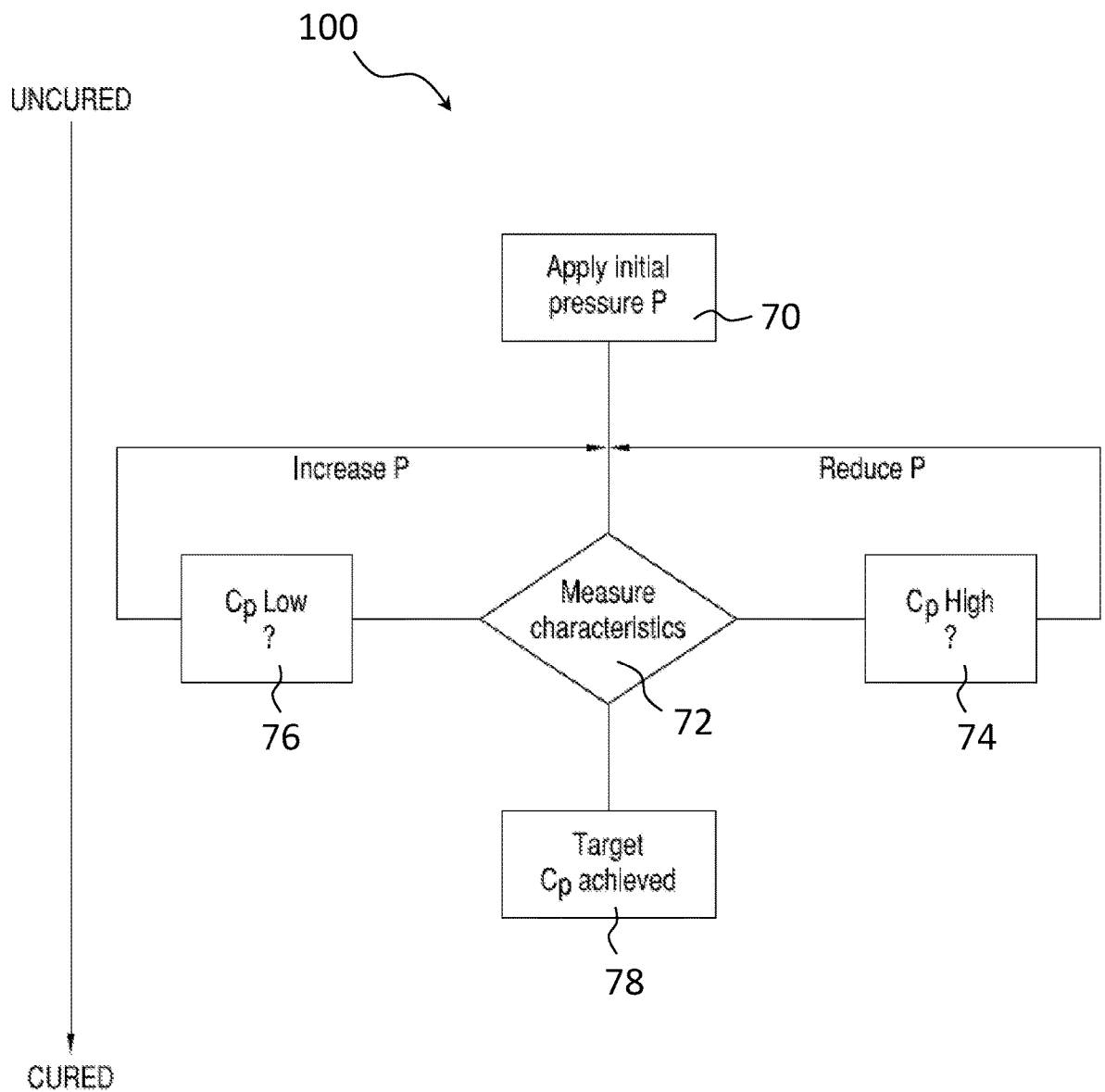
FIG. 7 shows a flow chart for a feedback control system.

Exemplary FIG. 7 refers generally to exemplary FIGS. 5-6. In exemplary FIG. 7, a flow diagram of feedback control system 100 using a control mechanism 120 similar to that as shown in exemplary FIG. 6 and described above may be shown. In a first step 70, an initial pressure may be applied to a chip assembly, for example an RFID chip being assembled into an RFID strap. Measurement system 110 may then measure an electrical property in step 72, for example the parasitic capacitance of the chip. Depending on whether $C_P$ is higher 74 or lower 76 than a desired value, control mechanism 120 may increase or decrease pressure on the assembly. Once the desired $C_P$ is achieved in step 78, the pressure may be maintained while making the position of the chip static with respect to associated bond pads or curing of the adhesive completes. Curing may be accomplished either at the end of the process or continuously throughout the process. In the latter case, an efficient feedback system may be necessary to quickly determine and apply the correct amount of pressure. The present invention contemplates that curing may be accomplished by methods known in the art and/or the following methods: using a hot melt adhesive, where the chip is moved when the chip is hot, and the position of the chip is made static by cooling; using a UV or other photo-curable adhesive; and/or using a two-part adhesive where the position is changed when the first part adhesive is in its liquid state but the adhesive is cured by application of a second material such as an accelerator or even using a structural adhesive which forms a temporary bond and then after time or exposure to heat or other energy becomes permanent.

The present invention also contemplates that curing may take place using a non adhesive implementation such as using a solder in which the chip is moved with the solder in its molten state and the position is fixed by cooling. The position of a static chip does not need to utilize an adhesive. For instance, various forms of welding, such as ultrasonic and thermosonic could be used in a non adhesive implementation. In another embodiment, a secondary operation may apply a material, such as a silicone referred to as a "blob top" to protect the chip and bond it.

Figure 8:
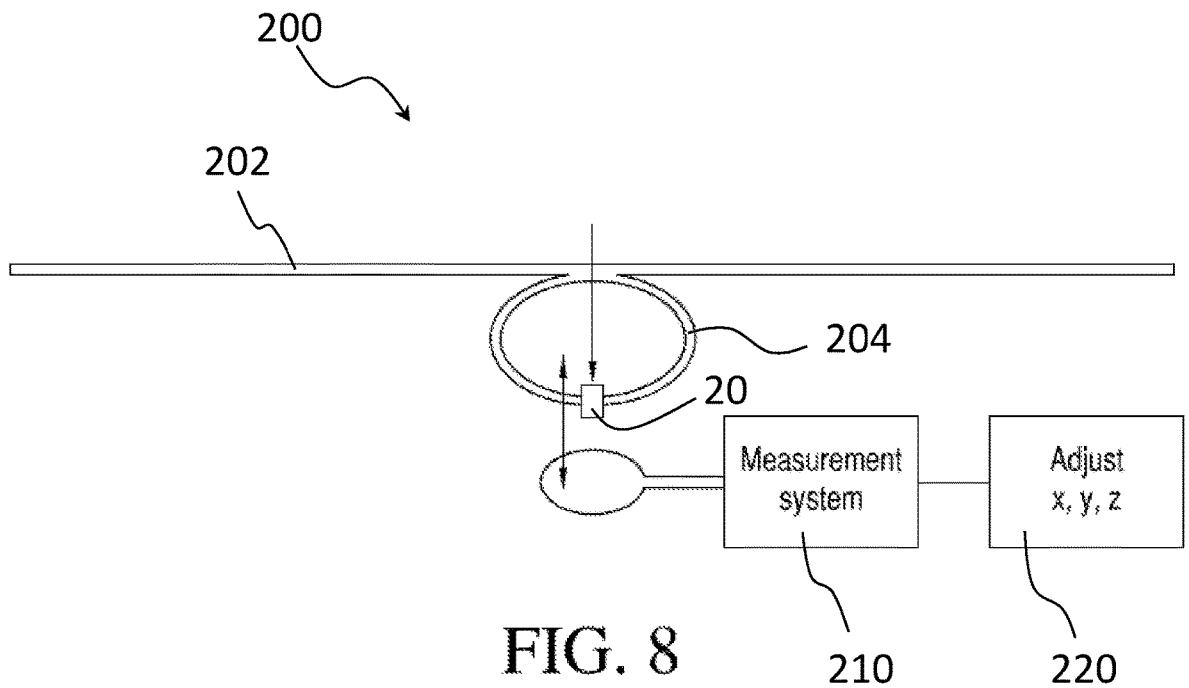
FIG. 8 shows an alternative embodiment of a feedback control system which may be used when an RFID chip is mounted on an antenna.

Referring now to exemplary FIG. 8, an alternative embodiment of a feedback control system 200 may be used when an RFID chip 20 is mounted on an antenna 202. Antenna 202 may have a central loop section 204 which may resonate with the parasitic capacitance $C_P$ of mounted RFID chip 20. In this embodiment, instead of capacitance, the magnetic adsorption frequency of the central loop section 204 is measured by measurement system 210. Measurement system 210 may be communicatively coupled with adjustment system 220, which may create or adjust a force F on chip 20 in any of the x, y, or z axes to control the location, placement, and/or spacing of chip 20.

Figure 9:
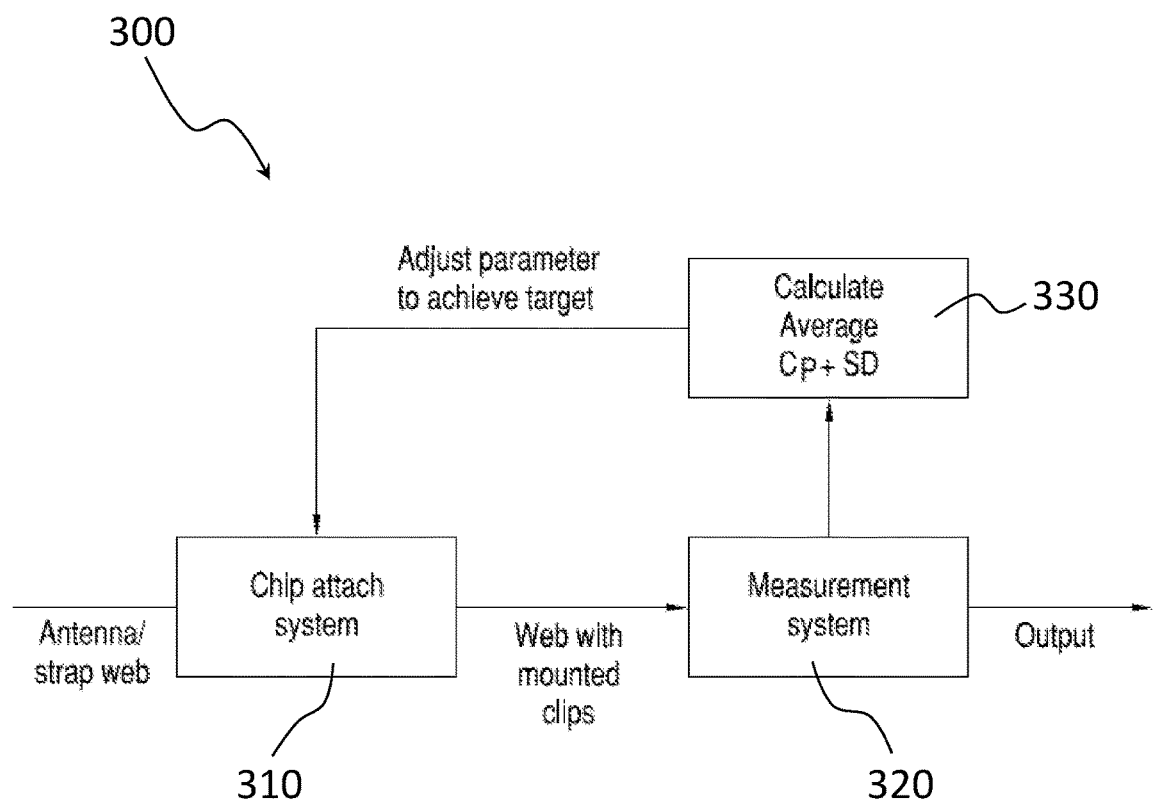
FIG. 9 shows a flow chart for an alternative embodiment of a feedback control system.

Referring now to exemplary FIG. 9, a feedback control system 300 may be used to calculate statistical information regarding multiple RFID chip assemblies, such as RFID straps, RFID antennas, or as desired. A chip attach system 310 may attach RFID chips to antennas or straps on a web. The web may then carry the assemblies to a measurement system 320, which may be similar to measurement system 110 as shown in exemplary FIG. 5 and described above. A computer 330 may then calculate the average parasitic capacitance $C_P$ and its standard deviation SD, if desired. Other statistical calculations may also be done, however only these two will be followed for clarity in this example. The calculated average $C_P$ and SD may then be used to adjust the parameters used in chip attach system 310. The adjustment of the parameters of chip attach system 310 may be done on a dynamic basis without pausing production, which may allow for real-time feedback between the adjustment and measurements by measurement system 320.

Referring generally to exemplary FIGS. 1-9, other exemplary embodiments are also envisioned. According to at least one exemplary embodiment, an RFID chip attach system may include at least one RFID chip, a feedback control system similar to any as described above, and a substrate for strap, antenna, or any other suitable assembly type, as desired. The RFID chip in this embodiment, which may be similar to RFID chip 10, may be designed and manufactured with a deliberately larger bonding area, allowing it to be attached to an assembly with poor dimensional stability. Though this characteristic is not often utilized in conventional manufacturing due to the resulting excessive variation in the assembly's electrical properties, in the chip attach system described herein, the feedback control system may dynamically control the resulting electrical properties, leading to less variation and a lower cost but still high-quality production process.

According to another exemplary embodiment, data from repeated dynamic feedback adjustment-measurements relating to how a particular adjustment affects a particular characteristic, for example $C_P$, may be stored, analyzed, and utilized to create a mapping of the result of particular adjustments in any of the x, y, or z axes. The mapping can then be re-integrated into the feedback control system such that less integrations of adjustment-measurement may be needed, which may significantly speed up the production process.

The present description is also valid for attaching a strap to an antenna, as the position of the strap could be dynamically altered over the chip pond pads. Pressure can be applied, and, in the case of capacitive attached the antenna bond pads could be designed to the joint capacitance which intentionally varies with position. For instance, the pads, in one embodiment, are narrower in the upper web direction compared to the further down position, so coupling capacitance, and hence the capacitance of the mounted strap is varied.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A feedback control system, comprising:
    a measurement system having a plurality of contact points; and
    a control mechanism communicatively coupled to the measurement system;
    wherein the measurement system is configured to measure at least one physical property of an RFID chip assembly while the RFID chip assembly is undergoing production, the RFID chip assembly having at least one RFID chip,
    wherein the control mechanism is configured to cause a force to be applied to the RFID chip in the RFID chip assembly in response to the measured physical property, the applied force causing a change in the measured physical property, and
    wherein the feedback control system is configured to allow for multiple iterations of a measurement of a physical property and application of force.

2. The feedback control system of claim 1, wherein the at least one physical property is capacitance.

3. The feedback control system of claim 1, wherein the at least one physical property is magnetic absorption frequency.

4. The feedback control system of claim 1, wherein the at least one physical property is resistance.

5. The feedback control system of claim 1, wherein the RFID chip assembly further comprises an RFID strap.

6. The feedback control system of claim 1, wherein the RFID chip assembly further comprises an RFID antenna.

7. The feedback control system of claim 1, wherein the control mechanism comprises at least one heated block.

8. The feedback control system of claim 7, wherein the at least one heated block is configured to be heated to a temperature of about 160-180° C.

9. The feedback control system of claim 1, wherein the measurement of the at least one physical property is accomplished via said contact points.

10. The feedback control system of claim 1, wherein the RFID chip assembly further comprises an adhesive, and
   wherein the control mechanism is further configured to cure said adhesive after the measurement system measures the at least one physical property at an optimum level.

11. The feedback control system of claim 1, wherein the control mechanism is configured to apply a force to the RFID chip in at least one of the following ways:
   ejecting the RFID chip from a wafer with a pin;
   moving a device carrying the RFID chip;
   pushing the RFID chip into contact with a bond area on the RFID assembly;
   controlling air pressure;
   controlling a magnetic field; or
   applying a current to an electroelastic polymer.

12. The feedback control system of claim 1, further comprising a collection of data, wherein the data is related to the relationship between an application of a force to the RFID chip and the change in the at least one physical property; and the application of the data optimizes the control mechanism for more efficient use.

13. The feedback control system of claim 1, wherein the control mechanism is configured to increase or decrease pressure on the assembly.

14. The feedback control system of claim 1, wherein the RFID chip assembly further comprises an antenna having a central loop section.

15. The feedback control system of claim 1, further comprising an adjustment system.

16. The feedback control system of claim 15, wherein the adjustment system creates or adjusts a force F on chip in any of x, y, or z axes to control location, placement, and/or spacing of chip.

17. The feedback control system of claim 1, further comprising a chip attach system that attaches RFID chips to antennas or straps on a web.

18. The feedback control system of claim 1, wherein the RFID chip has two connection points.

19. The feedback control system of claim 1, further comprising an adhesive containing electrically conductive particles.

20. The feedback control system of claim 1, continuously measures electrical properties.

* * * * *